United States Patent [19]

Brabetz et al.

[11] 4,231,692
[45] Nov. 4, 1980

[54] DRILL COMPRISED OF HARD METAL FOR DRILLING CONTACT HOLES IN CIRCUIT BOARDS AND THE LIKE

[75] Inventors: Bernhard Brabetz; Helmut Hackl, both of Munich, Fed. Rep. of Germany

[73] Assignee: Siemens Aktiengesellschaft, Berlin & Munich, Fed. Rep. of Germany

[21] Appl. No.: 942,279

[22] Filed: Sep. 14, 1978

[30] Foreign Application Priority Data

Sep. 19, 1977 [DE] Fed. Rep. of Germany ....... 2742104

[51] Int. Cl.³ ............................................. B23B 51/02
[52] U.S. Cl. ..................................... 408/230; 408/704
[58] Field of Search ............. 408/230, 211, 241, 704, 408/223

[56] References Cited

U.S. PATENT DOCUMENTS

| | | | |
|---|---|---|---|
| 1,407,546 | 2/1922 | Joseph | 408/230 X |
| 2,396,335 | 3/1946 | Moller | 408/230 |

FOREIGN PATENT DOCUMENTS 1704296  5/1971  Fed. Rep. of Germany .
561630   7/1977  U.S.S.R. ................................. 408/230

OTHER PUBLICATIONS

*Huette Handbook for Managing Engineers,* edited by Wilhelm Trust & John., vol. 6th Ed., 1964, p. 537d.

Primary Examiner—Z. R. Bilinsky
Attorney, Agent, or Firm—Hill, Van Santen, Steadman, Chiara & Simpson

[57] ABSTRACT

A hard metal drill is disclosed for drilling contact holes in multi-legend printed circuit boards formed of synthetic resin. The drill has a diameter of not more than 1.5 mm. and has main and secondary cutting edges and spiral-shaped flutes lying opposite the drill longitudinal axis. At least one of these edges has a different angle or a different legend with respect to a corresponding other edge. The amount of difference of the two cutting angles or lengths to be compared is selected such that a gap between the drill and an edge of the drill hole is at least 20 μm and not more than 50 μm. In order to produce such holes more readily, the two spiral-shaped flutes have different depths.

3 Claims, 3 Drawing Figures

U.S. Patent    Nov. 4, 1980    4,231,692
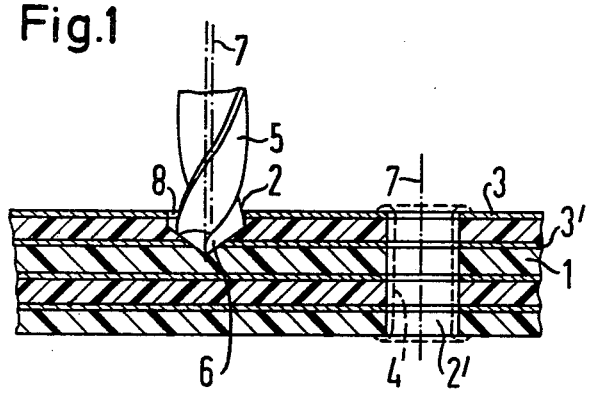
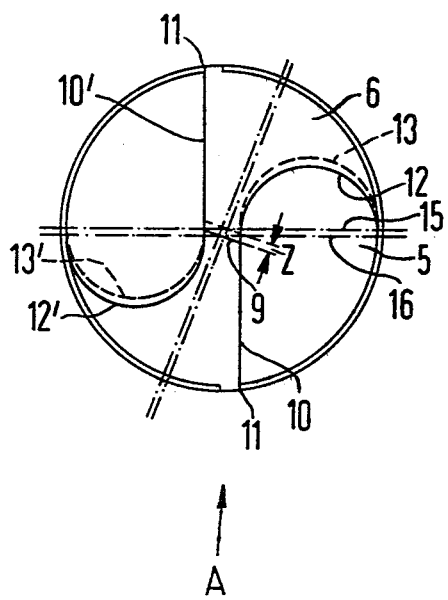
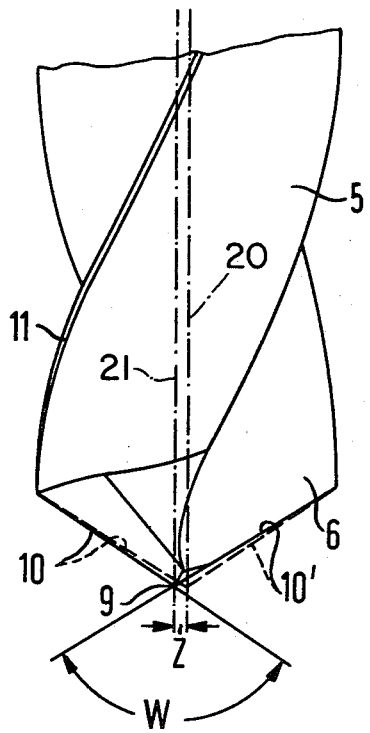

DRILL COMPRISED OF HARD METAL FOR DRILLING CONTACT HOLES IN CIRCUIT BOARDS AND THE LIKE

BACKGROUND OF THE INVENTION

The invention relates to a drill composed of hard metal having a diameter of a maximum of 1.5 mm for drilling contact holes in multilayer synthetic circuit boards. The drill has helical flutes in its twisted portion and two main and subsidiary cutting edges which are arranged opposite the drill axis, and at least one of these cutting edges possesses a different angle or a different length relative to the other similar cutting edge as described in German Patent Application No. P2655452.9, incorporated herein by reference. The difference between the two cutting angles or cutting lengths to be compared with one another is selected to be such that the opening of the driled hole at the drill inlet surface of the circuit boards amounts to at least 20 μm, but not more than 50 μm.

With materials which, when drilled, do not form continuous chips but drilling dust, the danger exists that the drilling dust wil be pressed against the walls of the bore by the subsidiary cutting edges of the drill where it will form a fixed film. This contamination is extremely difficult to remove. In the drilling of multi-layer circuit boards, the "smearing" of the contact holes leads to impure contacts between the individual inner layers. Therefore it has already been proposed in German Offenlegungsschrift No. 1,704,296 (incorporated herein by reference) to rapidly discharge the drilling dust by using a jet of compressed air by means of which the drilling dust is blown out of the contact holes during drilling or following drilling. High drilling speeds are used to drill contact holes of this type which have a diameter of a maximum of 1.5 mm in circuit boards composed of synthetic material; therefore twist drills composed of sintered material, so-called "hard metal" are used to drill the contact holes. In order to reduce smearing during drilling, so-called head drillers are used, whose twisted portions, which bear the flutes, behind the head-part are set back by approximately 0.006 mm. The length of the head part is about 0.6mm. This technique is utilized to prevent drilling dust being pressed against the walls of the bore, Nevertheless, this structural technique serves only to reduce, not, however, to eliminate the smearing.

The bit of the drill is formed by the transverse cutting edge which is adjoined by the main cutting edges on both sides of the central axis of the bore. These main cutting edges lead to the cutting edges of the twist drill which are adjoined by the helical subsidiary cutting edges which define the flutes. The transverse cutting edge is subject to the greatest load as it cuts less into the material but exerts a frictional action upon the material to be drilled.

During the regrinding of twist drills of all types, it can occur that the center of the main cutting edges or the center of the transverse cutting edges lies outside of the drill axis or that the main cutting edges possess unequal lengths or an unequal angle to one another. This has the disadvantage as noted in Huette Handbook for Managing Engineers, edited by Wilhelm Trust & John Volume I, 6th edition, 1964 page 537d Berlin, Munich, that the cutting edges are subject to unequal loads and there is an increase in the drilling dust during drilling. Furthermore the danger exists that the dril will slip. Consequently, an asymmetrical drill grinding surface is a disadvantage which should be avoided as far as possible. Therefore the dimensional differences between the grinding angles necessary during the grinding of the drills should not exceed 2° in the case of small drills of the type described in the introduction.

It has already been proposed that the lengths or angles of the cutting edges located on each side of the axis of the twisted portion of the drill should differ from one another. However, it is difficult to produce drill grinding surfaces of this type which are easily reproducible. Furthermore it is time consuming to measure drill grinding surfaces of this type in order to check the product.

SUMMARY OF THE INVENTION

In order to achieve an easily reproducible production process and in order to facilitate simple checking, in accordance with the invention it is proposed that the two helical flutes be provided with different depths.

This formation ensures that in spite of the asymmetrical grinding surface, the main and transverse cutting edges of the drill appear symmetrical in the field of view of the optics of a measuring microscope used to check the drill ground surface. The asymmetry of the grinding surface of the drill which is achieved in this way relates only to the main cutting edge lengths of the drill. The size, quantity and direction of the asymmetry can be easily reproduced in this way.

Due to the fact that the drill is ground several times during its life although the flutes are ground in only once, the design of the drill in accordance with the invention produce particular advantages.

The average difference between the two flutes provided in the twisted portion amounts to approximately $2 \cdot 10^{-2}$ mm to $3 \cdot 10^{-2}$ mm corresponding to a bore opening of a maximum of 50 μm.

BRIEF DESCRIPTION OF THE DRAWINGS

FIG. 1 is an enlargement illustrating the characteristics of the drill of the invention during the drilling of multi-layer circuit boards;

FIG. 2 is a bottom view of the drill bit; and

FIG. 3 is a side view taken from direction A of the bit of the drill corresponding to FIG. 2.

DESCRIPTION OF THE PREFERRED EMBODIMENTS

In an exemplary embodiment which has been enlarged approximately tenfold, FIG. 1 shows a cross-section through a multi-layer circuit board 1 in which contact holes 2 are to be drilled. The circuit board is composed of epoxide resin and possesses conductor paths 3, 3' etc. formed from metal. The conductor paths are contacted with one another in that following drilling, the bore holes 2' are provided with a metal layer 4—illustrated in broken lines—which establishes the contact between the conductor paths. Helical drills 5 composed of hard metal are used to drill the multi-layer circuit boards. The bit 6 of these helical drils possesses an asymmetrical grinding surface. This results in the fact that at its bit, the drill rotates eccentrically to the bore hole axis 7. This eccentric rotation always produces a bore hole gap 8 on one side. This prevents the smearing of drilling dust on the walls of the bore hole. The asymmetrical grinding surface of the drill cutting edges is selected to be such that a gap width or hole opening of at least 20μm to a maximum of 50 μm is achieved.

In accordance with FIGS. 2 and 3, for example, an asymmetrical grinding surface of the drill bit 6 is achieved by eccentrically displacing the transverse cutting edge 9 by the quantity Z. Here the symmetrical grinding surface of the main cutting edges 10 is represented in broken lines, whereas the asymmetrical grinding surface is represented by a solid line. The asymmetrical grinding surface and the different lengths of the two main cutting edges 10, 10' and the uniform length of the subsidiary cutting edges 11 inevitably result in an asymmetry of the transverse cutting edge 9. This asymmetrical grinding surface is produced with a symmetrical angle W about eccentric longitudinal axis 21 by means of an eccentric displacement from central longitudinal axis 20 (as shown in FIG. 3) by the quantity Z in the holding device during the grinding of the drill.

As can be seen in particular from FIG. 2, the flutes 12 and 12' are ground to different depths in the twisted portion of the drill 5. The broken contour line 13, 13' shows the flute normal depth and the normal grinding surface, whereas the solid contour line of the flutes 12, 12' is asymmetrical to the drill central lateral cross-sectional axis 15 and central to the eccentric lateral axis 16. As can be seen, the transverse cutting edge 9 which is offset from the center by the amount Z is now arranged symmetrically to the flutes 12, 12'. This symmetry can be easily recognized under a measuring microscope which allows the drill to be checked with respect to the correct, constantly uniform, asymmetrical grinding surface of the main cutting edges 10, 10'.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A hard metal drill for drilling contact holes in multi-layer circuit boards of synthetic resin, comprising:
   (a) a twisted portion having a grinding portion at a leading end thereof, a diameter of the twisted portion and grinding portion being a maximum of 1.5 mm;
   (b) said twisted portion having subsidiary cutting edges;
   (c) said grinding portion having main cutting edges and a transverse cutting edge therebetween, each of said main cutting edges being opposite and running into a spiral-shaped flute at the transverse cutting edge;
   (d) one of the main cutting edges being longer than the other cutting edge and the transverse cutting edge being laterally displaced from a central longitudinal axis of the drill such that when the drill is drilling a hole, a gap of at least 20 μm but less then 50 μm is formed between the outermost twisted portion of the drill and a side of the hole being drilled as a result of eccentric rotation of the drill;
   (e) said flutes having different depth dimensions with respect to one another; and
   (f) the flutes having depth dimensions chosen such that the flutes are asymmetrical to a central lateral cross-sectional axis of the dril and symmetrical to an eccentric lateral cross-sectional axis of the drill which is parallel to and displaced from the central lateral cross-sectional axis by a distance corresponding to the displacement of the transverse cutting edge from the central longitudinal axis.

2. The drill of claim 1 wherein the main cutting edges of different lengths form a symmetrical angle with respect to an eccentric longitudinal axis lateral to the drill central longitudinal axis.

3. The drill of claim 1 wherein the subsidiary cutting edges have a uniform length.

* * * * *